(12) United States Patent
Inoue et al.

(10) Patent No.: US 7,061,329 B2
(45) Date of Patent: Jun. 13, 2006

(54) SEMICONDUCTOR DEVICE HAVING BALANCED CIRCUIT FOR USE IN HIGH FREQUENCY BAND

(75) Inventors: Akira Inoue, Tokyo (JP); Akira Ohta, Tokyo (JP); Seiki Goto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/792,856

(22) Filed: Mar. 5, 2004

(65) Prior Publication Data
US 2004/0178854 A1  Sep. 16, 2004

(30) Foreign Application Priority Data
Mar. 14, 2003  (JP) .............................. 2003-069600

(51) Int. Cl.
*H03F 3/191* (2006.01)
(52) U.S. Cl. ...................... 330/302; 330/286; 330/295; 330/301
(58) Field of Classification Search ............ 330/124 R, 330/286, 295, 301, 302
See application file for complete search history.

(56) References Cited

U.S. PATENT DOCUMENTS

| | | | |
|---|---|---|---|
| 4,549,152 A * | 10/1985 | Kumar | 330/124 R |
| 4,588,962 A * | 5/1986 | Saito et al. | 330/295 |
| 5,017,886 A * | 5/1991 | Geller | 330/124 R |
| 5,053,719 A | 10/1991 | Tsai | |
| 6,097,250 A * | 8/2000 | Kamali et al. | 330/124 R |

FOREIGN PATENT DOCUMENTS

| JP | 6-6151 | 1/1994 |
|---|---|---|
| JP | 7-263634 | 10/1995 |

OTHER PUBLICATIONS

K. Inoue, "A 240 W Push-Pull GaAs Power FET for W-CDMA Base Stations", 2000 *IEEE*, pp. 1-4, *Fujitsu Quantum Devices Ltd.*, Japan.

* cited by examiner

*Primary Examiner*—Khanh Van Nguyen
(74) *Attorney, Agent, or Firm*—Leydig, Voit & Mayer, Ltd.

(57) ABSTRACT

A semiconductor chip for amplification is connected between input-side and output-side matching circuits, and each of matching circuits includes balanced circuits which receive signals different in phase by 180 degrees, divided from an input signal. The balanced circuits are connected at a virtual grounding point, which is used as a grounding point sensitive to RF characteristics in an IPD. Thus, a semiconductor device can be free from influence of variations of grounding wires and can be reduced in size, weight, and cost.

13 Claims, 14 Drawing Sheets

US 7,061,329 B2

SEMICONDUCTOR DEVICE HAVING BALANCED CIRCUIT FOR USE IN HIGH FREQUENCY BAND

BACKGROUND OF THE INVENTION

1. Field of the Invention

The present invention generally relates to a semiconductor device, and particularly to a semiconductor device having a balanced circuit for use in a high frequency band of 800 MHz or higher.

2. Description of the Related Art

In a conventional semiconductor device having a plurality of IC chips mounted on one package, an intermediate electrode portion is provided between the IC chips to electrically connect them and to also connect them externally. The intermediate electrodes are symmetrically arranged on an insulating board. A variety of circuit patterns are fixed on the surface of the insulating board, and a plurality of semiconductor chips are mounted and connected onto the respective circuit patterns with solder.

For example, there is proposed a conventional high-frequency high-power semiconductor device employing a push-pull high-power amplifier (for example, see Patent Documents 1 and 2 as listed below). FIG. 14 is a top view showing an example of the conventional semiconductor device; and FIG. 15 is a diagram showing an equivalent circuit of the push-pull high-power amplifier as shown in FIG. 14. In this example of the conventional device, the push-pull high-power amplifier is disclosed for use in a base station for mobile communications and generally used in a high frequency band of 0.8 to 2.4 GHz.

Referring to FIGS. 14 and 15, reference numeral 1 represents a PCB insulating board, on which all the circuit components are mounted including semiconductor chip components attached onto wirings with solder. An input signal is divided by an input-side balun 2 into two signal components having different phases by 180 degrees with each other. Each of the signal components is amplified by a semiconductor chip 4 such as a field-effect transistor (FET) and combined by an output-side balun 2 on the right side. In such a push-pull type device, distorted components generated by the FETs 4 are cancelled, so that a failure due to distortion can be reduced.

In the drawings, reference numerals 6 and 6' represent a two-stage internal matching circuit board, which converts a low impedance of each FET 4 into a high impedance. Reference numeral 11 represents a conductive wire such as a metal wire, 3 a package, and 5 a lead of the package. On the PCB board 1, wirings 10 are formed and capacitors 9 as a chip capacitor element and a chip resistor 8 are mounted. Through-hole wirings 7 are provided in the board to connect each electrode on the front side of the board to a grounded electrode on the backside thereof.

Patent Document 1: Japanese Patent Laid-Open No. 6-6151 (1994), paragraph 0022 and FIG. 1.

Patent Document 2: Japanese Patent Laid-Open No. 7-263634 (1995), paragraph 0011 and FIG. 1.

However, in the above-mentioned conventional push-pull high-power amplifier, a large part of the circuit components are provided on the PCB board 1. The device having such an amplifier is disadvantageously large in size, relatively heavy, and high in cost. Moreover, in the conventional device, the chip components and the like are mounted by solder on the wirings, and therefore an error of alignment or variations in high-frequency characteristics (RE characteristics) can disadvantageously be increased. In particular, if the chip capacitor element 9 (capacitor C) is out of position in the matching circuit, including reactors L, capacitors C, and the like, in a portion from the balun to the package lead, the value of the reactor L is equivalently changed and mismatching occurs so that the high-power amplifier has an undesirably significant change in characteristics.

SUMMARY OF THE INVENTION

The present invention has been made to solve the above problems. It is therefore an object of the present invention to provide a semiconductor device which can be reduced in size, weight and cost and in which variations in RF characteristics caused by an error of component alignment can be reduced.

For the purpose of achieving the above object, the semiconductor device according to the present invention includes an input-side matching circuit; an output-side matching circuit; a semiconductor chip for an amplifier connected between the input-side and output-side matching circuits; and a pair of balanced circuits provided in each matching circuit. The pair of balanced circuits produce signals from an input signal, having different phases by 180 degrees with each other. The pair of the balanced circuits are connected to each other by wirings and is provided in an IPD.

In the above configuration, both balanced circuits of each matching circuit are connected at a virtual grounding point, which can be used as a grounding point sensitive to the RF characteristics. Therefore, variations in ground inductance or the influence of variations of the grounding wire can be excluded in the matching circuits formed in the IPD. Thus, the semiconductor device can be reduced in size, weight and cost, and variations in RF characteristics depending on the accuracy of component alignment can also be reduced.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DETAILED DESCRIPTION OF THE PREFERRED EMBODIMENTS

Figure 1:
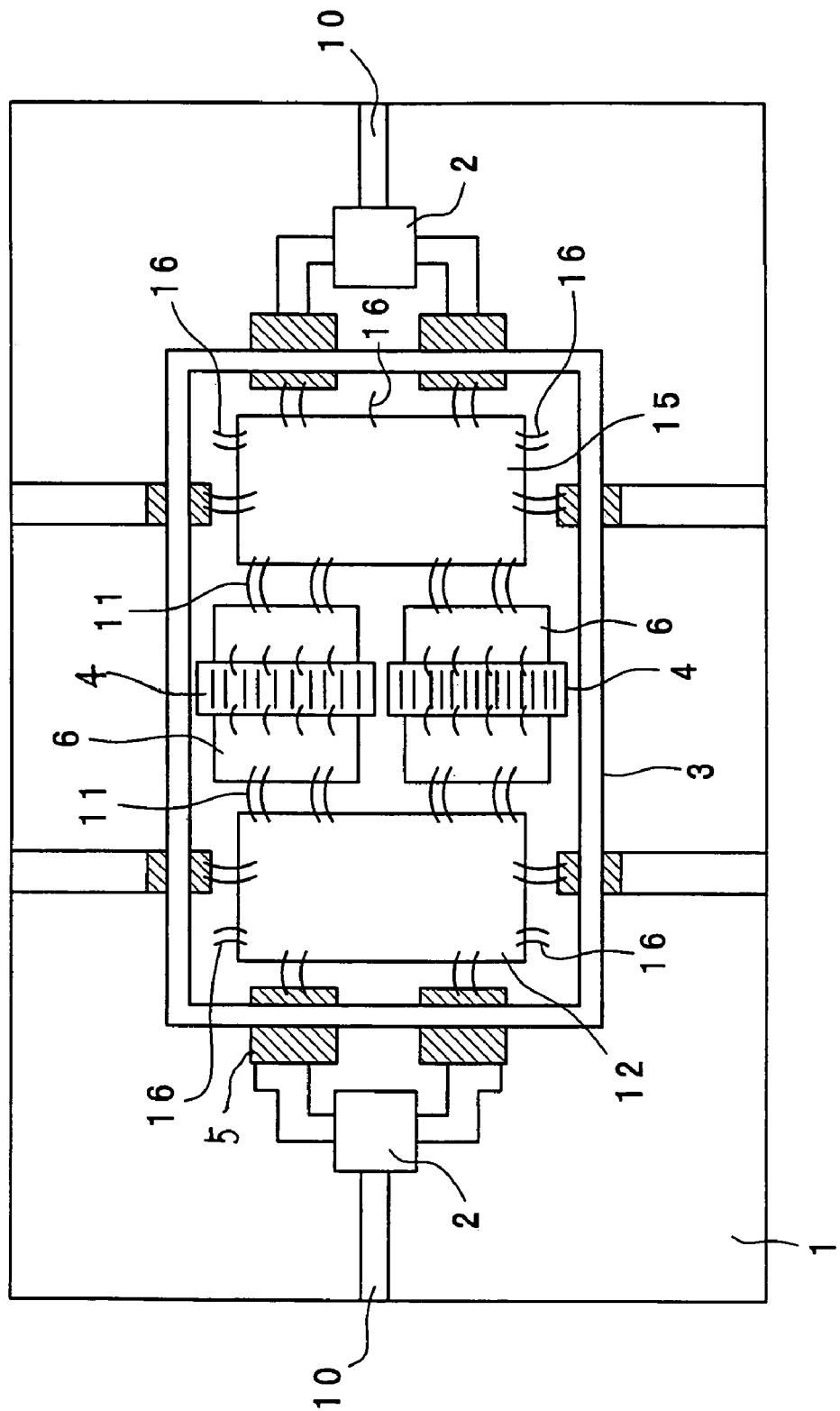
FIG. 1 is a top view of a semiconductor device according to a first embodiment of the present invention.

Referring to the attached drawings, the embodiments of the present invention are described below. The illustrated embodiments are directed to specific semiconductor devices as shown in the drawings. However, such illustrated embodiments are not intended to limit the scope of the present invention. For example, the present invention can also be applied to any other composite semiconductor devices in which any other semiconductor chips are incorporated in one package. In the drawings, common elements are represented by the same reference numeral, and duplication of description will be avoided.

First Embodiment

Figure 2:
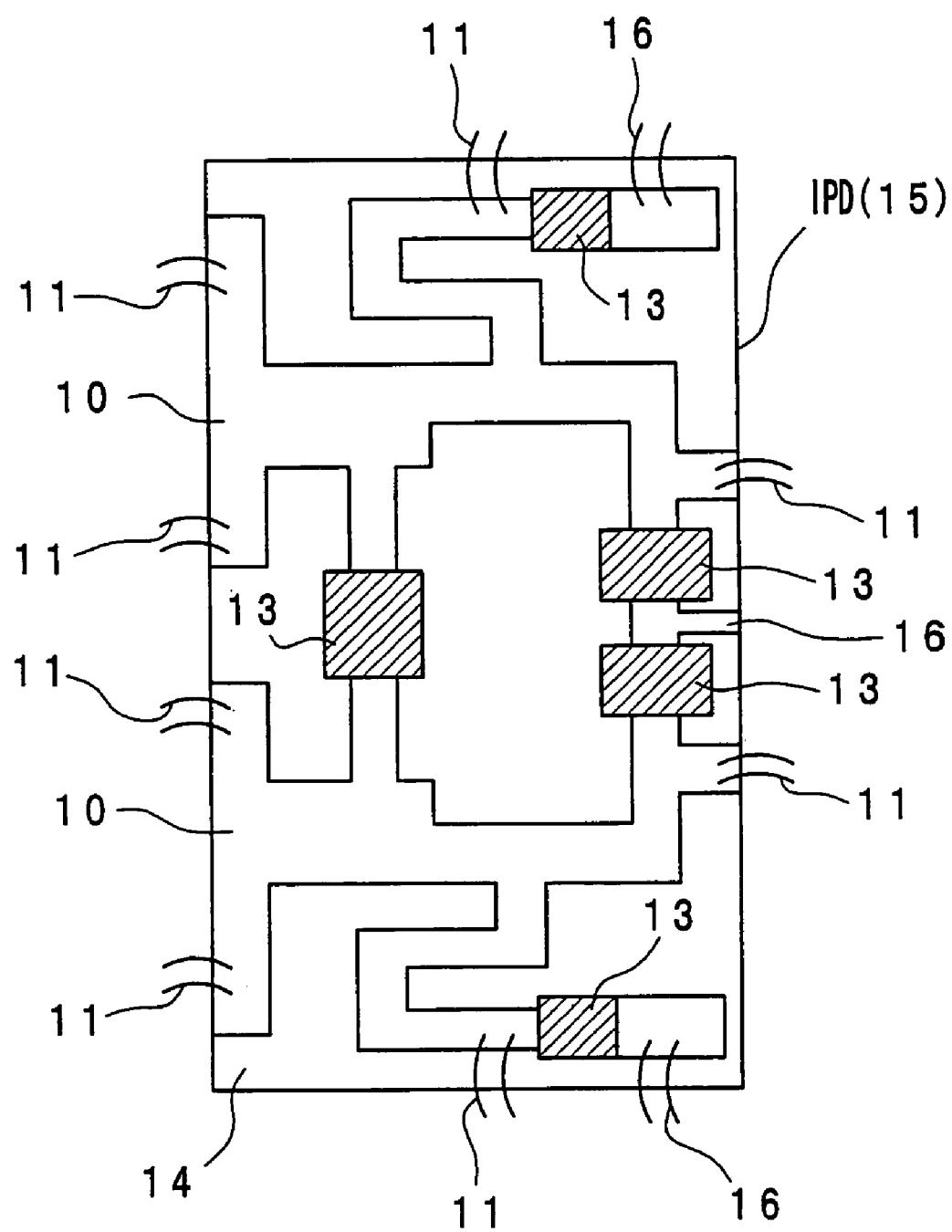
FIG. 2 is a top view of an output-side balanced matching circuit shown in FIG. 1.
Figure 3:
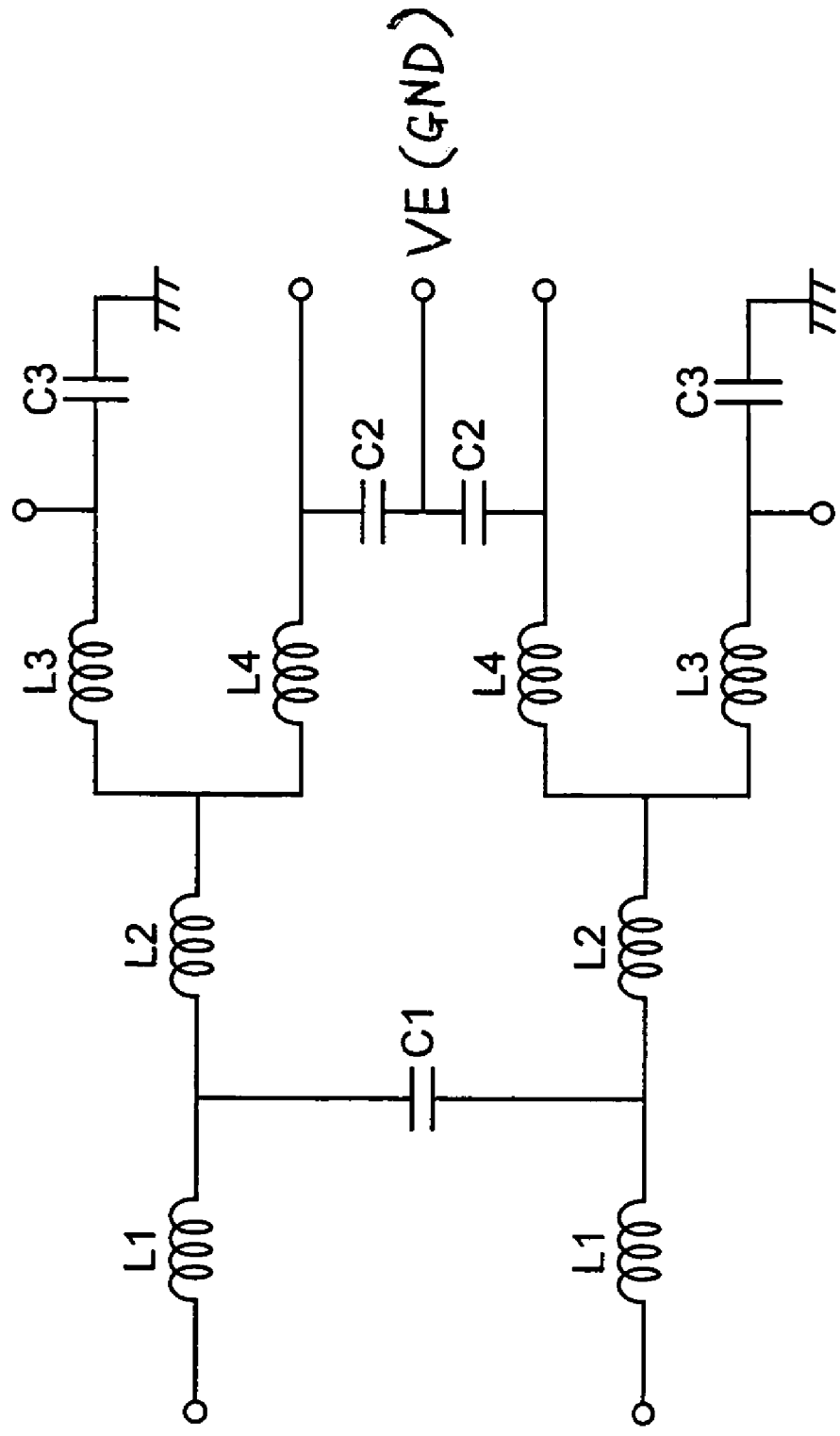
FIG. 3 is a diagram showing an equivalent circuit of the matching circuit shown in FIG. 2.

Referring to FIGS. 1 to 3, a first embodiment of the present invention is described below. FIG. 1 is a top view of the semiconductor device according to the first embodiment of the present invention; FIG. 2 is a top view of an output-side balanced matching circuit thereof, and FIG. 3 is an equivalent circuit diagram thereof.

The illustrated structure shows a push-pull high-power amplifier which is generally used in a high frequency band of 0.8 to 2.4 GHz. In FIG. 1, reference numeral 1 represents a housing of a PCB board (i.e., an insulating board) on which circuit components are mounted. Reference numeral 2 represents a balun, which is a passive distributed constant circuit used for connection (conversion) from a balanced line to an unbalanced line and vice versa. Reference numeral 3 represents a package. Reference numeral 4 represents a high-frequency amplifying semiconductor chip which is comprised of a field effect transistor (hereinafter, referred to as "FET").

The balun 2 on the input side (on the left side of the drawing) also serves as a power divider and divides an input signal into two signal components that are different in phase by 180 degrees from each other. Each of the signal components is inputted to the FET 4 via an IPD 12 (which will be described later) and amplified by the FET 4 and then inputted to the balun 2 on the output side (on the right side of the drawing) via an IPD 15 (which will be described later), and then combined by the balun 2 at the terminal which also serves as a power combiner. In such a push-pull structure, distorted components generated by the FET 4 are cancelled, so that a failure due to distortion can be reduced.

In the drawings, reference numeral 5 represents a lead of the package, and 6 an internal matching circuit board, which converts a low impedance of the FET 4 into a high impedance. Reference numeral 10 represents wirings formed on the board, and 11 a conductive wire such as a metal wire including an inductor element. Reference numeral 12 represents an input-side IPD, 13 an MIM capacitor (C), 14 an insulating substrate of the IPD, 15 an output-side IPD, and 16 a grounding wire. The grounding wire 16 connects the electrode on the front surface of the IPD substrate to the grounded electrode on the package side.

Herein, IPD refers to an Integrated Passive Device which is a high-frequency passive device having a glass substrate or an Si substrate including an $SiO_2$ oxide film, where an MIM capacitor, wiring, a resistor, and the like are integrally formed on the substrate but not including any via hole. In the present embodiment, the IPDs 12 and 15 on the input and output sides respectively, are mounted in the package 3.

In the equivalent circuit configuration of the output-side IPD 15 as shown in FIG. 3, serially connected inductances L1, L2 and L3 and ground capacitances C1 and C2 of the balanced circuit converts the impedance of the output-side internal matching circuit board 6 of the FET 4 into the impedance of the output-side balun 2. Each IPD has two stages of LC matching circuits, in which one stage of the internal matching circuit board 6 is reduced than the conventional configuration, and the matching circuits are placed in the package on the PCB board 1.

The IPD is generally formed in a similar manner to a silicon (Si) wafer process, and therefore wirings can be formed with an accuracy of 2 μm or less and the MIM capacitor 13 or the resistor can be formed with a high capacitance or resistance accuracy of 5 to 10% or less. In contrast to the chip components, the IPD pattern can be formed with a high accuracy, and a fine process can be performed to form the IPD, so that the IPD structure can be formed in a small size and therefore at a low cost.

According to the present embodiment, small circuits with a size of the order of millimeters can be formed in place of the conventional PCB board circuits with a size of the order of centimeters. In addition, the IPD has an advantage that a loss can be low in the high frequency band, because the IPD substrate has a resistance higher than that of an Si substrate. The circuit elements are also monolithically formed so that the distance between the circuit elements can be kept constant and that the RF characteristics can be stable.

In terms of low cost, however, the IPD is generally formed with no via hole. Therefore, a grounding wire should be used to connect the grounded electrode to the package-side grounded electrode. The length of the grounding wire can has a variation of 50 to 100 μm or more depending on the assembling accuracy of the wire bonder. The shape of the wire has also significant variation in the assembling process. In particular, when resin molding is performed in sealing, deformation of the wire may occur, which would be a cause of unstable RF characteristics. In a high frequency band, a change in the length and/or shape of the wire can lead to a change in a parasitic inductance component and problematically lead to significant variations in the RF characteristics. In particular, the components of the ground capacitances C1 and C2 used in the LC matching circuit significantly affect the RF characteristics of the semiconductor device.

In the present embodiment, therefore, both channel circuits of the balanced circuit are formed in the same IPD, and the ground capacitor C1 and a pair of ground capacitors C2 opposed and connected to each other are provided at portions which connect both channels in parallel. Therefore, a virtual grounding point VE (GND) is provided at the center of C1 and at the connection between two C2. Thus, an ideal grounded electrode can be obtained regardless of the length, shape or the like of the grounding wire 16 (or regardless of the absence of the wire 16), so that an IPD type matching circuit can be achieved with no assemble variation.

It is noted that the arrangement shown in FIG. 3 may be modified by replacing the grounding capacitors with grounding inductors. Specifically, in this modification, each of the input-side matching circuit and output-side matching circuit include capacitors connected serially and ground inductors connected between the pair of balanced circuits so that the pair of balanced circuits receive the signals different in phase by 180 degrees, and a connecting wire for connecting the ground inductors between the pair of balanced circuits is grounded to a virtual grounding point.

Figure 4:
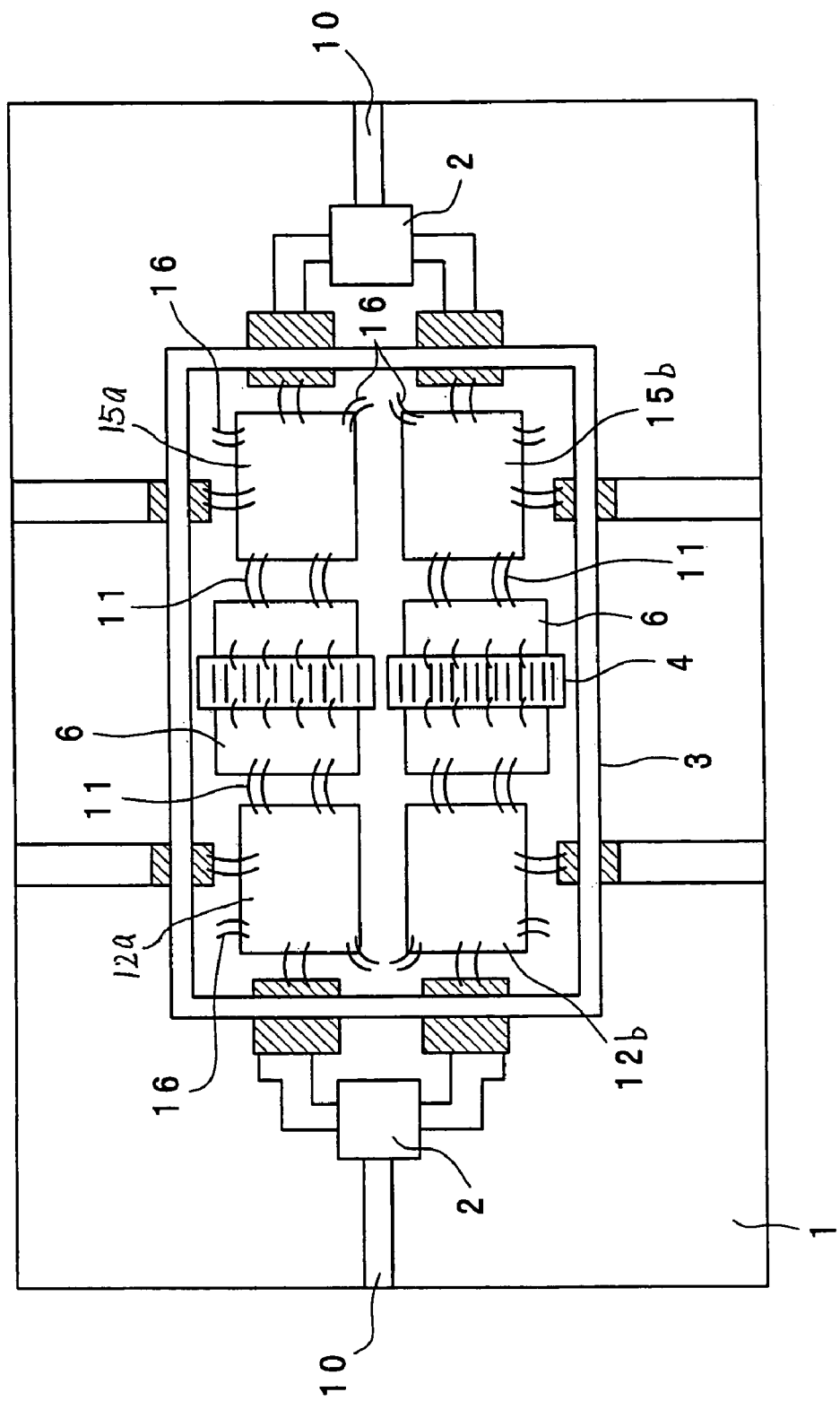
FIG. 4 is a top view showing a comparative example in which each matching circuit includes separate IPDs.
Figure 5:
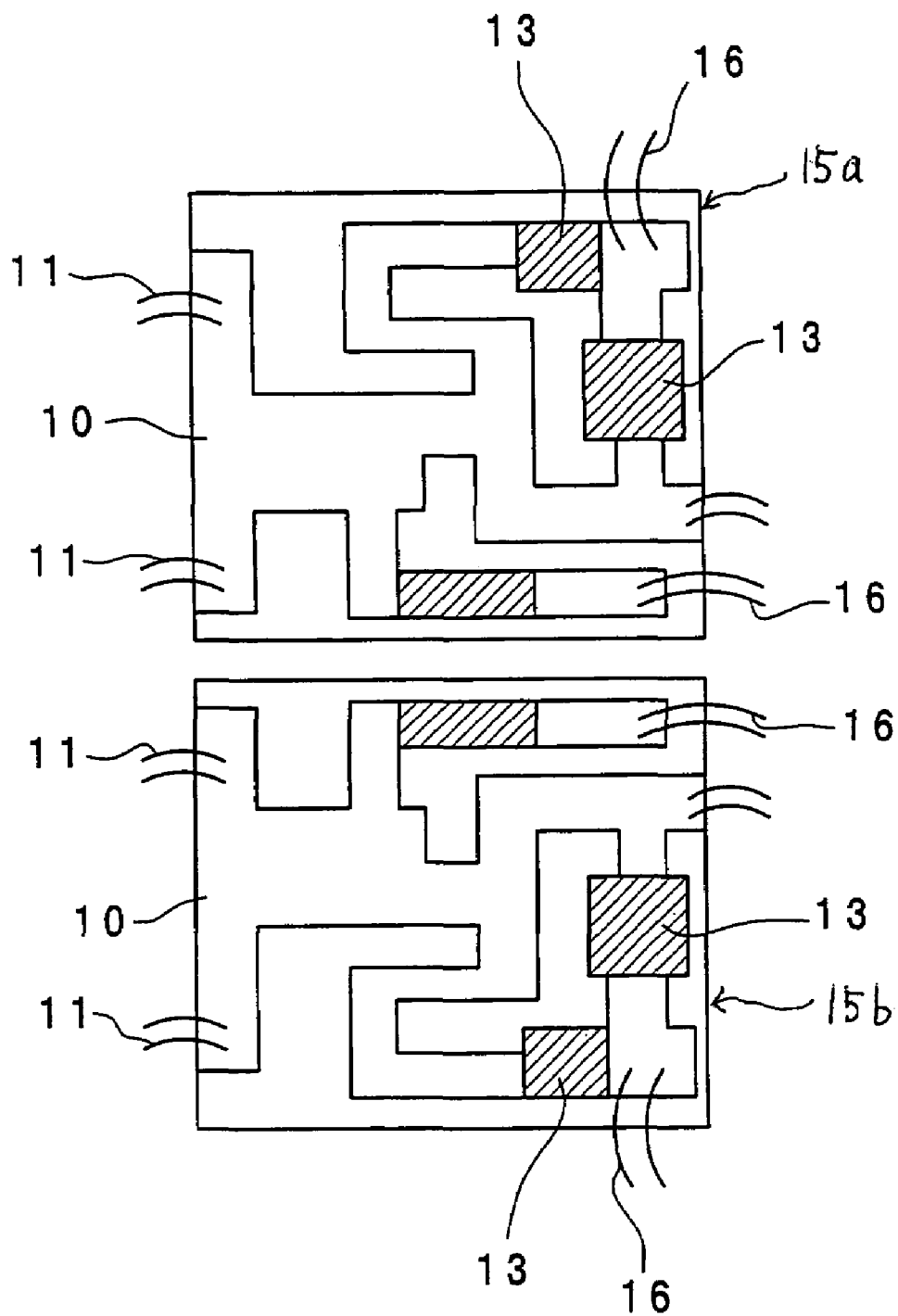
FIG. 5 is a top view of an output-side IPD shown in FIG. 4.
Figure 6A:
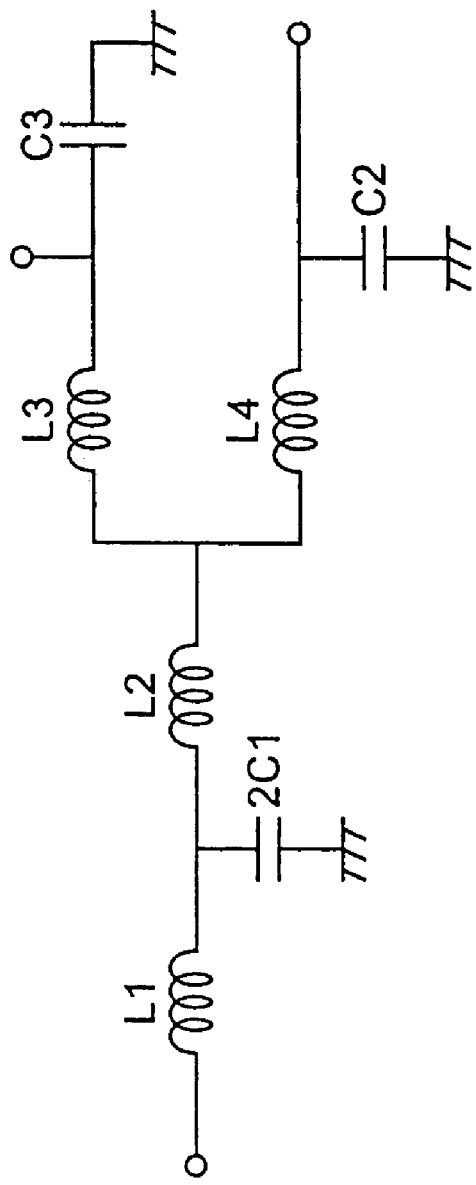
FIGS. 6(a) and 6(b) are diagrams showing equivalent circuits of the IPD shown in FIG. 5.
Figure 6B:
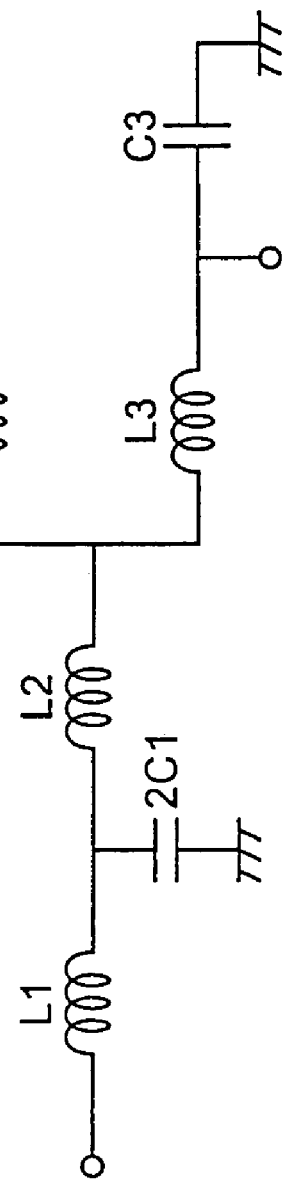

FIG. 4 shows a comparative example in which each channel matching circuit is comprised of separate IPDs (12a, 12b; 15a, 15b). FIG. 5 is a top view showing the IPDs 15a and 15b on the output side, and FIGS. 6(a) and 6(b) are diagrams showing equivalent circuits. In the comparative example as shown in FIGS. 6(a) and 6(b), the ground capacitance of the capacitor attached to the connection between the inductors L1 and L2 is twice as much as that of the capacitor C1 as shown in FIG. 3, so that the comparative circuit can be equivalent to the circuit as shown in FIG. 3. In this comparative example, the IPDs 15a and 15b are separately provided in the balanced circuit with no connection between both channels, and the virtual electrode (VE) as shown in FIG. 3 is not used. Therefore, the ground (GND) sides of the ground capacitors 2C1, C2 and C3 are all connected via each grounding wire 16 to the grounded electrode of the package 3 under the IPD substrate.

Such a comparative example is influenced by the grounding wire 16, because each channel matching circuit (LC circuit) of the balanced circuit is provided in the separate IPDs 15a and 15b, respectively, and both matching circuits as shown in FIGS. 6(a) and 6(b) are not connected to provide the virtual grounding point. In the matching circuit with such a circuit configuration, the impedance is converted by L1, L2, L3, and 2C1 and C2. In particular, therefore, such a circuit configuration can be significantly affected by variations in the length and shape of the grounding wire 16 connected to 2C1 or C2, so that the RF characteristics of the semiconductor device are significantly varied.

In contrast thereto, according to the first embodiment as shown in FIGS. 1 to 3, the matching circuits of the balanced circuit are integrally provided in the same IPD, and the virtual grounding point VE formed by connecting both matching circuits is used as a grounding point particularly sensitive to the RF characteristics, so that the IPD can be free from the problem of variations in ground inductance. Therefore, the matching circuits can integrally be formed in the IPD with no influence of variations of the grounding wire. Thus, the semiconductor device can be reduced in size, weight and cost, and variations in RF characteristics depending on the accuracy of component alignment can also be reduced.

In the present first embodiment as shown in FIGS. 1 to 3, a connection point between a pair of ground capacitors C2 is used as the virtual grounding point VE (GND) and connected to the grounded electrode via the grounding wire 16. In terms of high-frequency characteristics, the virtual grounding point as described above does not have to be connected to the grounded electrode. However, the electric potential of the virtual grounding electrode VE can be a floating potential in a DC manner, because the potential of the grounding electrode is cut off in a DC manner by the two capacitors C2.

Therefore, when an electric charge is supplied from external static electricity to generate a high potential, the potential may be higher than the withstand potential of the MIM capacitor, whisch leads to problematically breakdown. For the purpose of preventing such electrostatic discharge damage, the virtual grounding point is connected to the grounded electrode via the wire 16 so that the charge can be released.

In this case, some variations in the length or shape of the wire 16 do not affect the RF characteristics, because the virtual grounding point is provided with respect to the RF characteristics. On the other hand, the electrostatic charge or the like can be released via the grounding wire 16 in a DC manner, so that the electrostatic discharge damage can be prevented. In the present embodiment, the virtual grounding point VE is grounded via the wire 16. Alternatively, the virtual grounding point may be connected to the power supply source of the FET to bring about the same effect. Alternatively, the virtual grounding point may be grounded via a high-resistance resistor or connected to the power supply source of the FET via a high-resistance resistor to bring about the same effect.

The illustrated embodiment uses the FET 4 for the amplifier. The present invention is not limited to such a construction, and any other transistor such as a heterojunction bipolar transistor (HBT) and the like may be used to form the amplifier.

Second Embodiment

Figure 7:
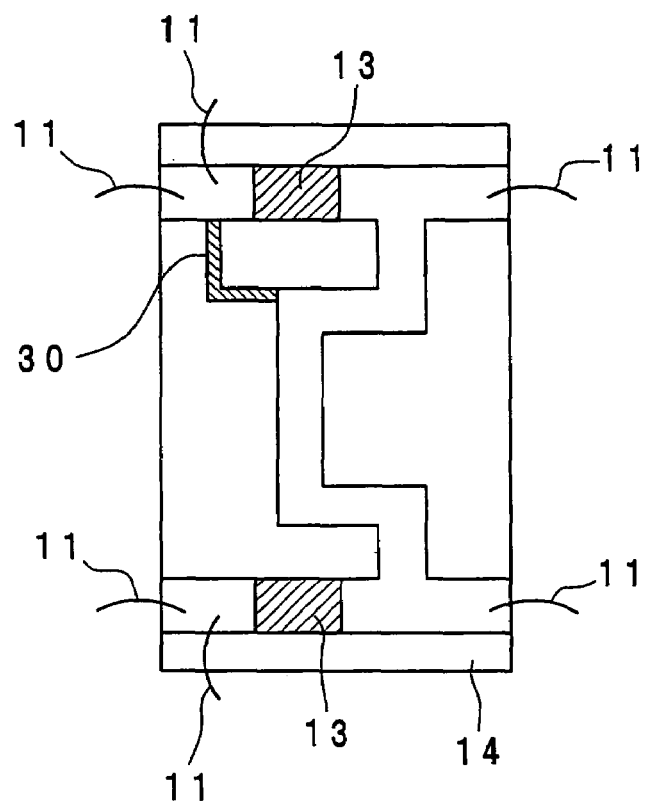
FIG. 7 is a top view of an output-side IPD of a semiconductor device according to a second embodiment of the present invention.
Figure 8:
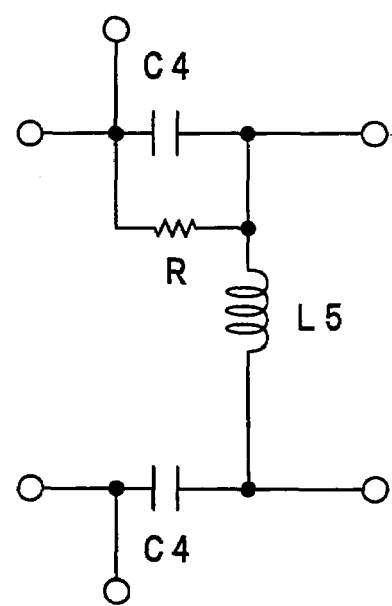
FIG. 8 is a diagram showing an equivalent circuit of the IPD shown in FIG. 7.

Referring to FIGS. 7 and 8, a second embodiment of the present invention is described below. FIG. 7 is a top view of an output-side IPD of the semiconductor device according to the second embodiment of the present invention; and FIG. 8 is a diagram showing an equivalent circuit thereof. In the first embodiment, the matching circuit comprises serial L1, L2 and L3 and ground capacitors C1 and C2. In contrast thereto, in the second embodiment, the matching circuit includes a capacitor C4 and a ground inductor L5 in serial, and the inductor L5 connects both channel matching circuits.

In the configuration as shown in FIGS. 7 and 8, the balanced circuits include the upper circuit and the lower circuit, which are different in phase by 180 degrees from each other. Therefore, the midpoint of the inductor L5 connecting both matching circuits provides a virtual grounding point, and the device can operate as if it is grounded at a half of the inductance L5. Such grounding can be ideal for high frequency, and the grounded circuit is formed on the IPD with no grounding wire 16. Therefore, the IPD can be free from variations in ground inductance.

The use of the IPD can reduce the size, weight and cost of the matching circuit of the semiconductor device and can also reduce variations in RF characteristics depending on the accuracy of component alignment.

In the circuit configuration of the present embodiment, a part of the inductor L5 is cut off in a DC manner by the MIM capacitor 13 (C4), so that it may be considered as a floating potential disadvantageously provided in a DC manner. For the purpose of preventing such a disadvantage, a resistor 30 with a high resistance of several MΩ is provided to form a connection to the power supply source of the FET. Such a high-resistance resistor 30 does not affect the RF characteristics but can have an effect of preventing electrostatic discharge damage in a DC manner.

Third Embodiment

Figure 9:
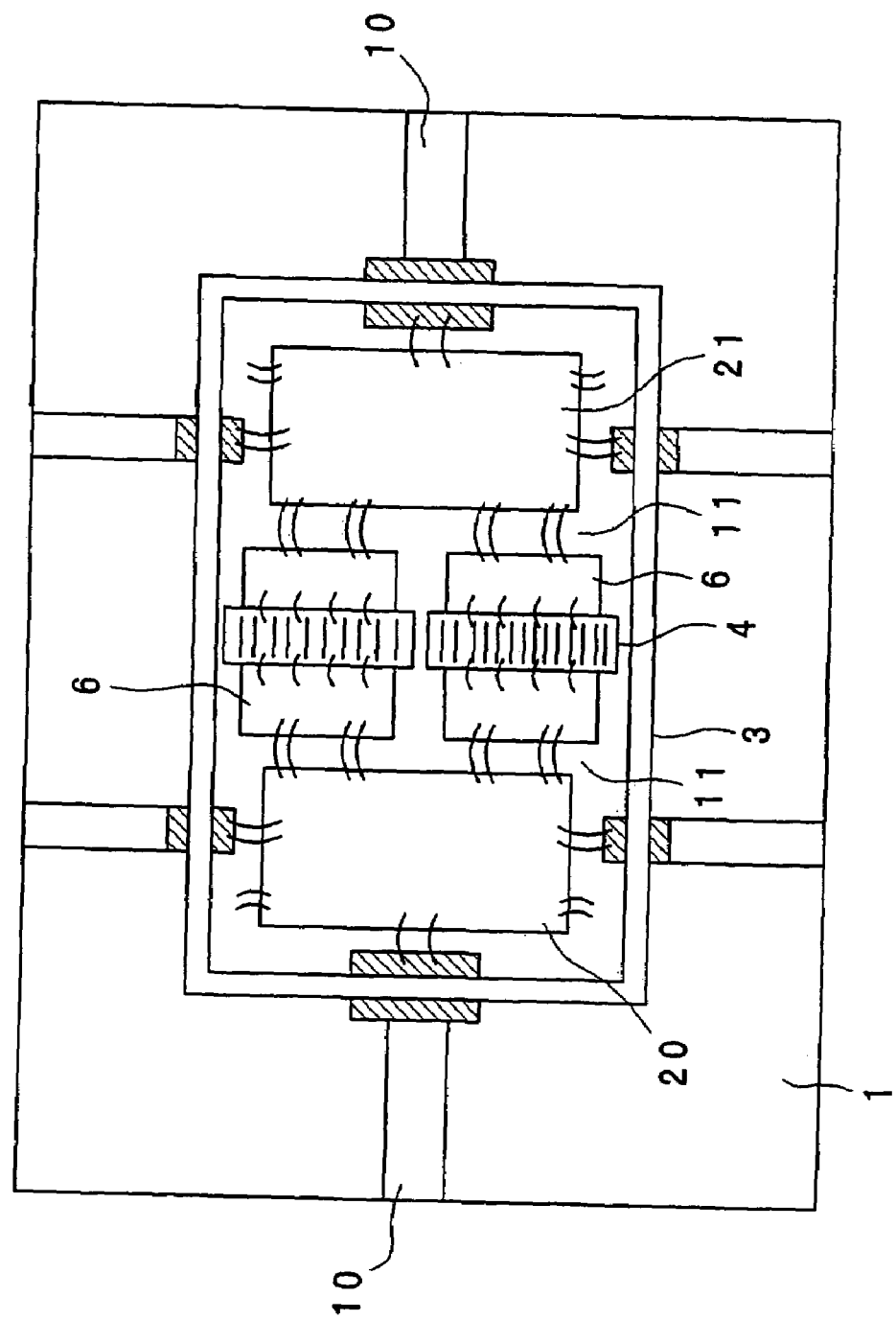
FIG. 9 is a top view of a semiconductor device according to a third embodiment of the present invention.
Figure 10:
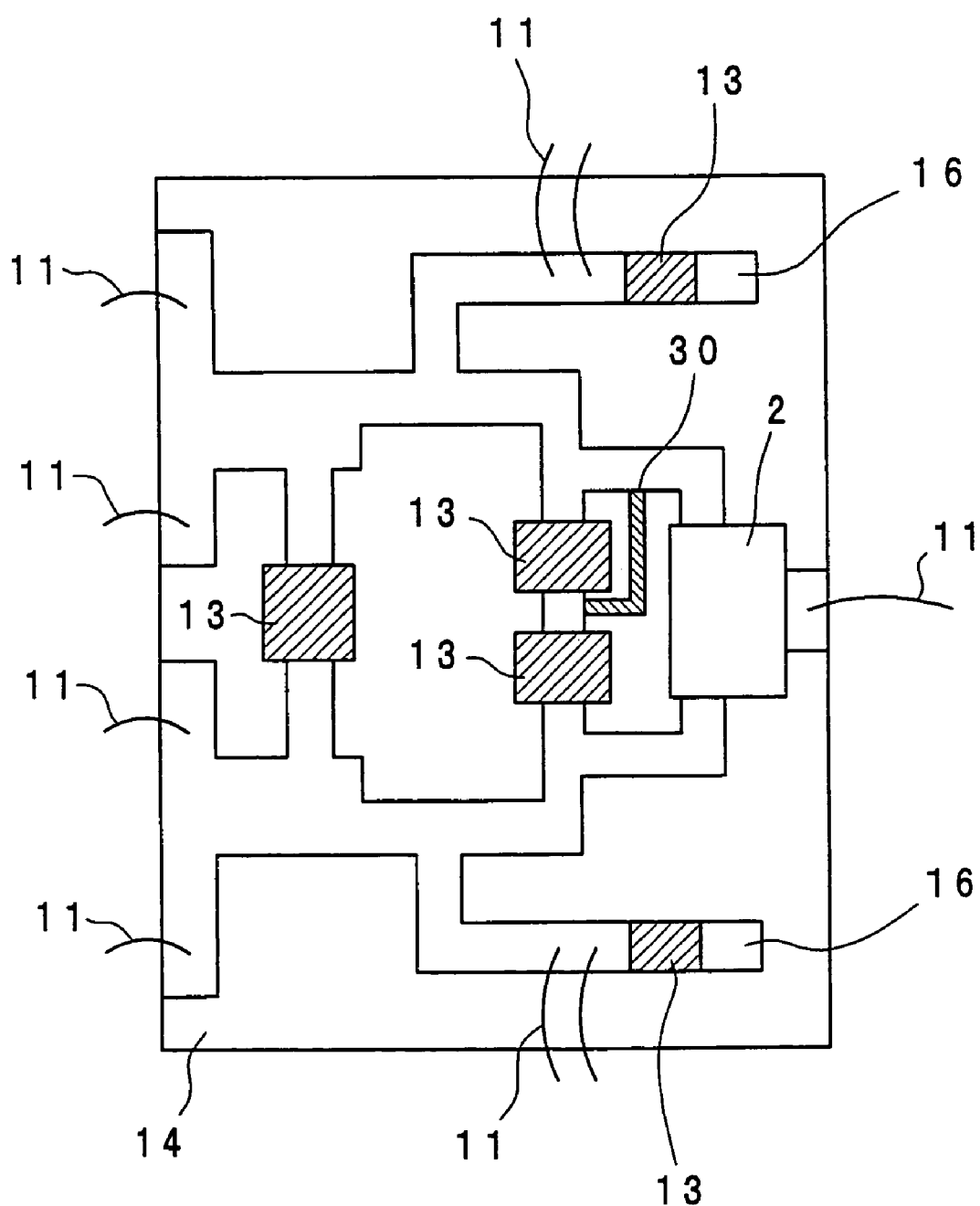
FIG. 10 is a top view of an output-side balun-containing IPD shown in FIG. 9.
Figure 11:
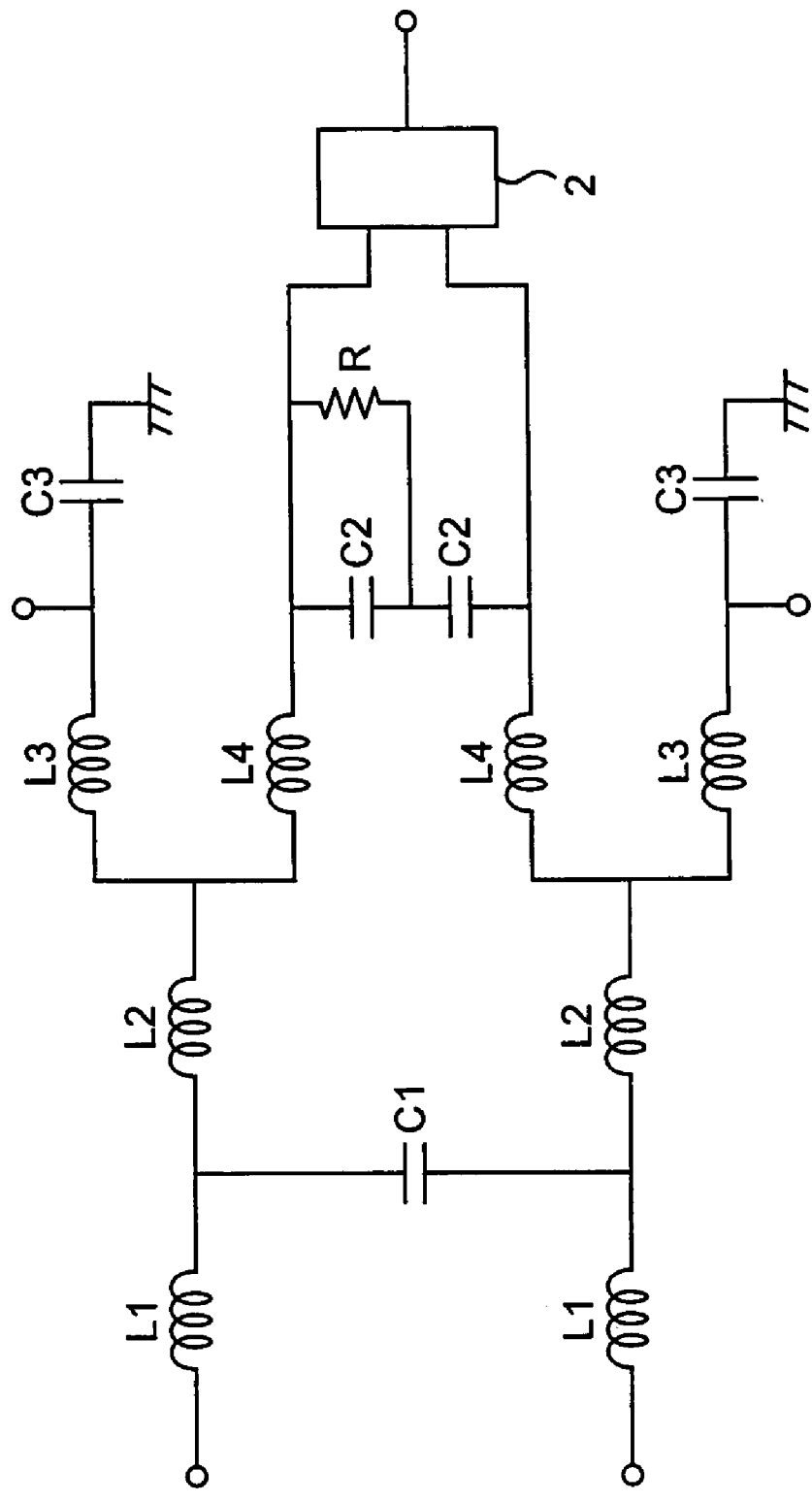
FIG. 11 is a diagram showing an equivalent circuit of the IPD shown in FIG. 10.

Referring to FIGS. 9 to 11, a third embodiment of the present invention is described below. FIG. 9 is a top view of the semiconductor device according to the third embodiment of the present invention; FIG. 10 is a top view of an output-side balun-containing IPD thereof, and FIG. 11 is a diagram showing an equivalent circuit of the IPD as shown in FIG. 10.

In FIGS. 9 to 11, reference numeral 20 represents an input-side balun-containing IPD, and 21 an output-side balun-containing IPD. In the third embodiment, the balun 2 is included in each of the IPDs 20 and 21 on the input and output sides.

Since the balun 2 is formed on the substrate in the IPD, the device can further be reduced in size, weight and cost as compared with the first embodiment. In this configuration, the balun or the matching circuit does not have to be directly formed on the PCB board 1. The elements such as the balun and the matching circuit may be mounted on a package 3 and formed into a semiconductor device, which may be mounted on the PCB board 1.

Thus, the number of the components and the cost of mounting can be reduced. In the semiconductor device having the elements mounted on the package, the balanced matching circuit and the balun 2 can be connected via the wiring directly on the IPD substrate without any other wire, so that variations in phase between both circuits can be eliminated, which would otherwise be caused by variations of the wire.

For the purpose of preventing the virtual grounding point from providing a floating potential in a DC manner, the virtual grounding point is connected via a resistor 30 with a high resistance of several MΩ to the drain-side power supply wiring of the FET and to the power supply source of the FET, similarly to the second embodiment.

In the present embodiment, the IPD circuit configuration includes the balun. However, the present invention is not limited to such a configuration, and any other circuit such as a BTL circuit or a hybrid circuit may be used as far as it can generate phases shifted by 180 degrees from one input to both circuits and can monolithically be formed on the IPD substrate.

Fourth Embodiment

Figure 12:
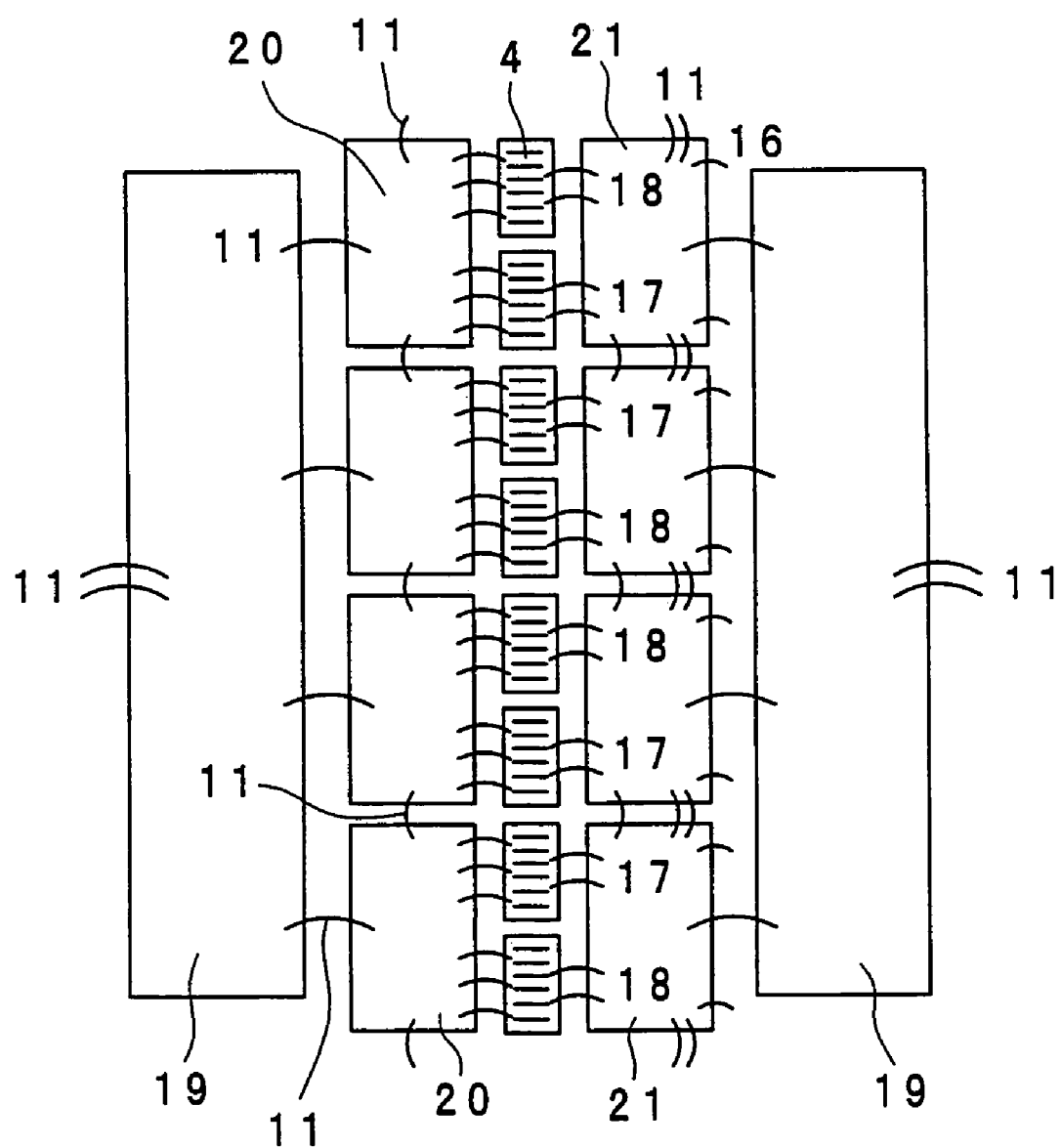
FIG. 12 is a top view of a semiconductor device according to a fourth embodiment of the present invention.
Figure 13:
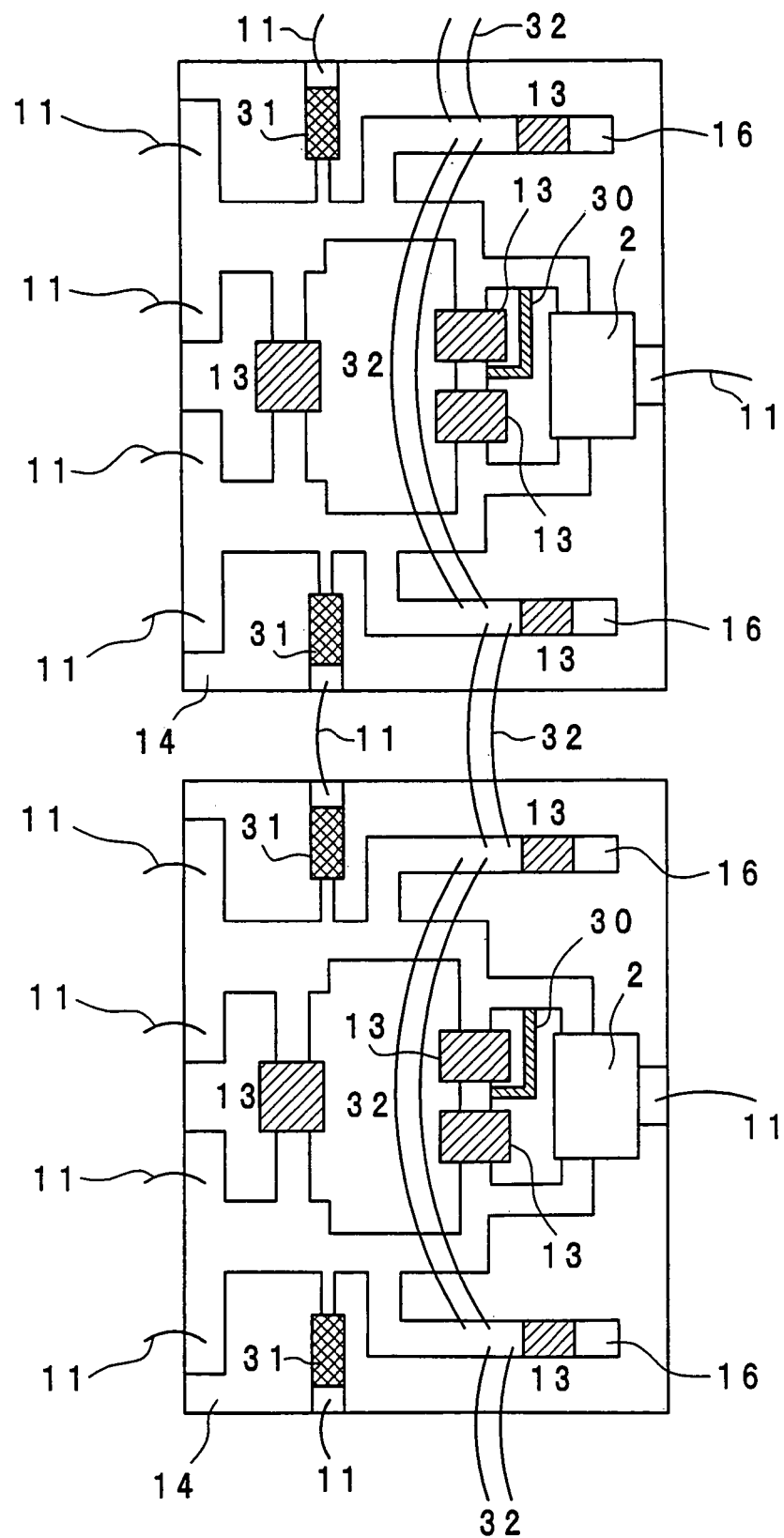
FIG. 13 is a top view showing, in an enlarged manner, the adjacent IPD portions shown in FIG. 12.
Figure 14:
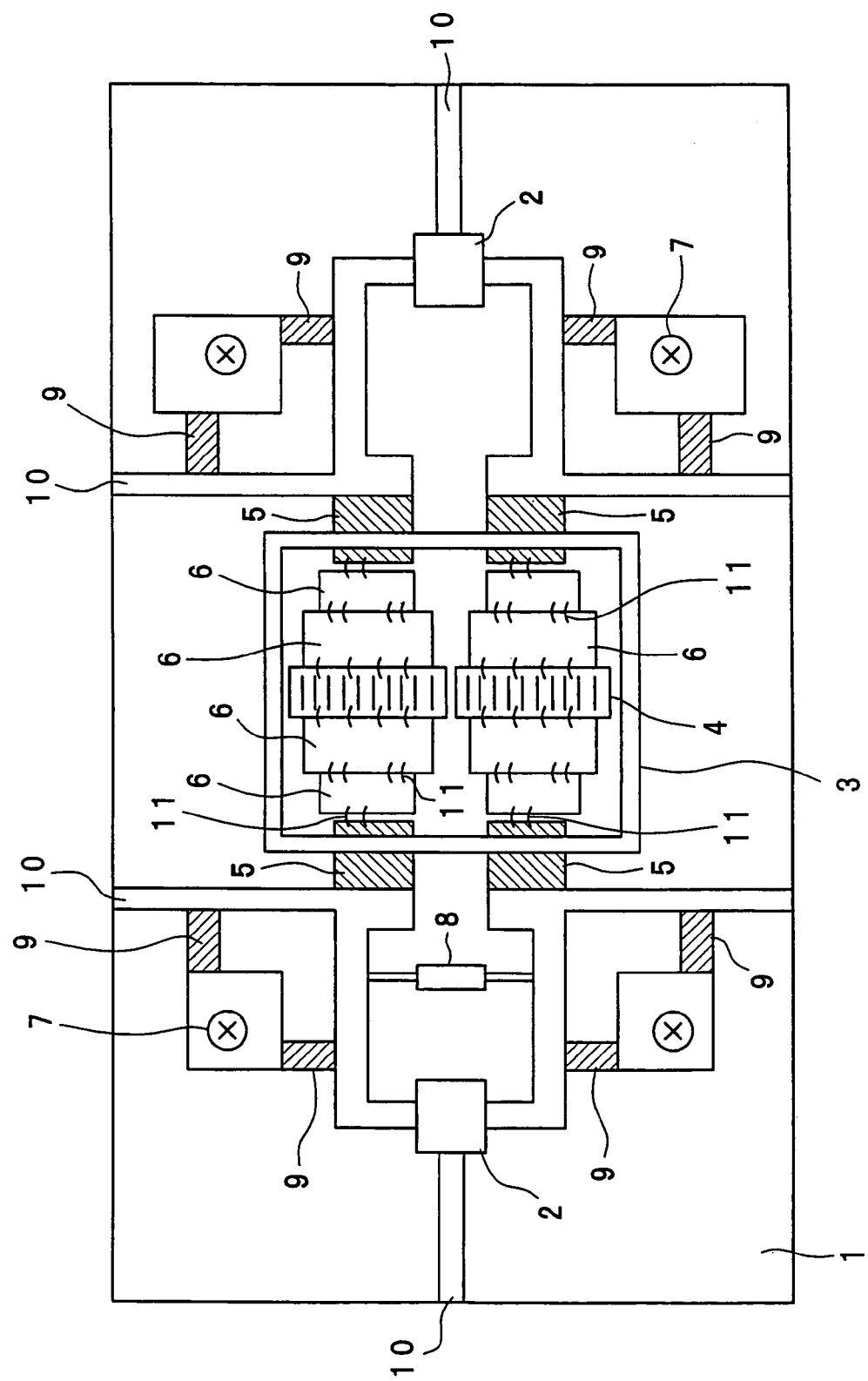
FIG. 14 is a top view showing a conventional semiconductor device.
Figure 15:
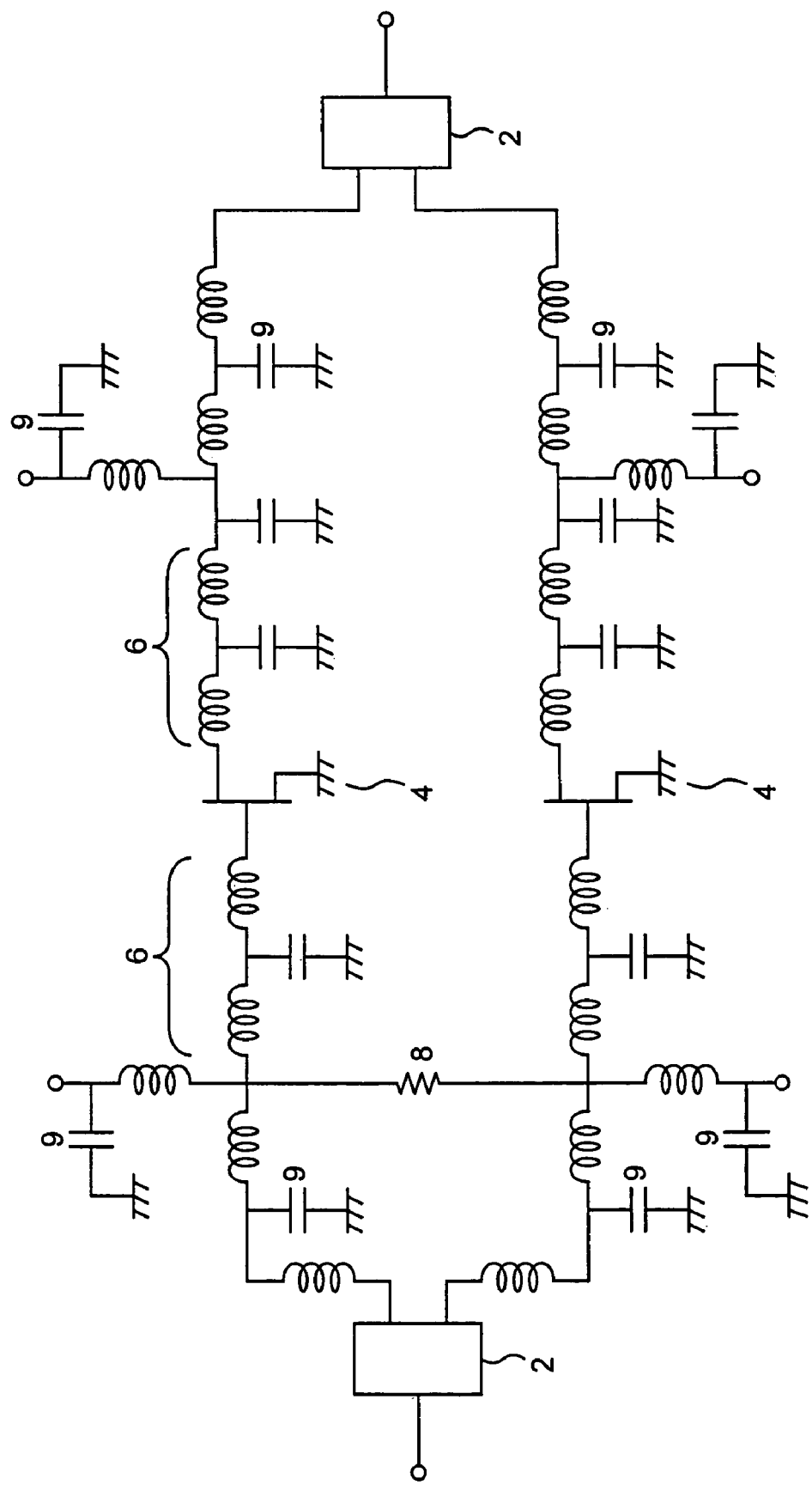
FIG. 15 is a diagram showing an equivalent circuit of the device shown in FIG. 14.

Referring to FIGS. 12 and 13, a fourth embodiment of the present invention is described below. FIG. 12 is a top view of the semiconductor device according to the fourth embodiment of the present invention; and FIG. 13 is a top view showing the adjacent IPD components thereof in an enlarged manner. The fourth embodiment is characterized in that a plurality of balanced circuit IPDs 20 and 21 are connected in parallel and combined.

In FIG. 12, reference numeral 17 represents a power supply signal component 0 degrees in phase distributed from each balun, 18 a power supply signal component 180 degrees in phase distributed from each balun, 19 a power dividing circuit provided on the input side, and 19' a power combining circuit provided on the output side. The input power is distributed from the input-side power dividing circuit 19 to each input-side balun-containing IPD 20 and amplified by the FET 4. The amplified power supply signals (17 and 18) are supplied to the output-side power combining circuit 19' via each output-side balun-containing IPD 21 and then combined.

Since the plurality of the balanced circuit IPDs 20 and 21 are connected in parallel and combined, each FET can be small in size and power. Therefore, the impedance of the FET can be made high, and the impedance conversion ratio between the input-side and output-side impedance matching circuits can be reduced, so that losses can be reduced in the matching circuits. In addition, the RF power of each IPD can be small, so that the matching circuit can be constructed with the components of smaller L, C and R and that the IPD can be reduced in size.

Referring to FIG. 13, the virtual grounding point placed between the MIM capacitors is connected via a high-resistance resistor 30 to the drain-side power supply wiring so that the floating state in a DC manner can be prevented and that the electrostatic discharge damage can be prevented. The drain-side power supply wires are all connected via drain biasing wires 32, and the power is supplied from both sides of the semiconductor device.

In-phase signal lines of the adjacent IPDs are connected via a wire 11 and each resistor 31 from each signal line. Basically, no current flows through the resistor 31, because both signal lines are the same in phase and therefore have the same potential. If an odd mode is generated, however, a phase can be reversed. In such a case, a current flows through the resistor 31 so that the reverse phase signal can be attenuated. Such an effect can suppress the odd mode for parasitic oscillation so that the stable semiconductor device can be obtained, with suppression of oscillation.

In the semiconductor device of the present embodiment, each set of FET has a push-pull configuration, and therefore distortion components can further be suppressed in the FET as compared to the configuration with a simple parallel combination. Since the IPDs are used in the input/output parts for the FET 4, the semiconductor device can be reduced in size, weight and cost, and variations in RF characteristics depending on the accuracy of component alignment can also be reduced.

According to the present invention as described above, a pair of matching circuits with a balanced circuit configuration are provided in each IPD, and both matching circuits are connected to provide a virtual grounding point, which is used as a grounding point sensitive to the RF characteristics. In such a configuration, variations in ground inductance or the influence of variations of the grounding wire can be excluded in the matching circuits formed in the IPD. Therefore, the semiconductor device can be reduced in size, weight and cost, and variations in RF characteristics depending on the accuracy of component alignment can also be reduced.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor device comprising:
    an input-side matching circuit having paired first and second input-side circuits;
    an output-side matching circuit having paired first and second output-side circuits;
    first and second transistors for amplification, wherein the first transistor is connected between the first input-side circuit of the input-side matching circuit and the first output-side circuit of the output-side matching circuit and the second transistor is connected between the second input-side circuit of the input-side matching circuit and the second output-side circuit of the output-side matching circuit;
    a first balanced circuit connected to the input-side matching circuit and respectively supplying to the first and second input-side circuits of the input-side matching circuit two signals different in phase by 180 degrees; and a second balanced circuit connected to the output-side matching circuit, and respectively receiving from the first and second output-side circuits of the output-side matching circuit two signals different in phase by 180 degrees, wherein at least one of the first and second balanced circuits includes a first inductor, a second inductor, and a capacitor connected between the first inductors and the second inductor, the capacitor being connected to a virtual grounding node.

2. The semiconductor device according to claim 1, wherein the input-side and output-side matching circuits, the first and second balanced circuits, and the first and second transistors are mounted in a single package.

3. A semiconductor device comprising:
an input-side matching circuit having paired first and second input-side circuits;
an output-side matching circuit having paired first and second output-side circuits;
first and second transistors for amplification, wherein the first transistor is connected between the first input-side circuit of the input-side matching circuit and the first output-side circuit of the output-side matching circuit and the second transistor is connected between the second input-side circuit of the input-side matching circuit and the second output-side circuit of the output-side matching circuit;
a first balanced circuit connected to the input-side matching circuit and respectively supplying to the first and second input-side circuits of the input-side matching circuit two signals different in phase by 180 degrees; and
a second balanced circuit connected to the output-side matching circuit, and respectively receiving from the first and second output-side circuits of the output-side matching circuit two signals different in phase by 180 degrees, wherein at least one of the first and second balanced circuits includes a first capacitor, a second capacitor, and a ground inductor connected between the first and second capacitors.

4. The semiconductor device according to claim 1, further comprising:
an input-side balun connected to the first balanced circuit for conversion of an input signal into the two signals different in phase by 180 degrees that are supplied to the first balanced circuit; and
an output-side balun connected to the output-side matching circuit for conversion of the two signals different in phase by 180 degrees which have been amplified by the first and second transistors and output from the output-side matching circuit into an output signal.

5. The semiconductor device according to claim 3, further comprising:
an input-side balun connected to the first balanced circuit for conversion of an input signal on a balanced line into the two signals different in phase by 180 degrees that are supplied to the first balanced circuit; and
an output-side balun connected to the output-side matching circuit for conversion of the two signals different in phase by 180 degrees which have been amplified by the first and second transistors and output from the output-side matching circuit into an output signal.

6. The semiconductor device according to claim 3, wherein the input-side and output-side matching circuits, the first and second balanced circuits, and the first and second transistors are disposed in a single package.

7. The semiconductor device according to claim 4, wherein the input-side and output-side matching circuits, the first and second balanced circuits, the input-side and output-side baluns, and the first and second transistors are disposed in a single package.

8. The semiconductor device according to claim 5, wherein the input-side and output-side matching circuits, the first and second balanced circuits, the input-side and output-side baluns, and the first and second transistors are disposed in a single package.

9. The semiconductor device according to claim 3, wherein the ground inductor comprises a pair of inductors connected serially at a node and the node is connected to a grounded electrode via a resistor.

10. The semiconductor device according to claim 3, wherein the ground inductor comprises a pair of inductors connected serially at a node and the node is connected to a power supply source via a resistor.

11. A semiconductor device comprising:
an input-side signal-dividing circuit;
an output-side signal-combining circuit;
a plurality of first balanced circuits connected in parallel to each other, the plurality of first balanced circuits being connected to the input-side signal-dividing circuit, each of the first balanced circuits outputting a pair of output signals different in phase by 180 degrees;
a plurality of second balanced circuits connected in parallel to each other, the plurality of second balanced circuits being connected to the output-side signal-combining circuit, each of the second balanced circuits receiving a pair of signals different in phase by 180 degrees; and
a plurality of transistors for amplification, each of the transistors being located between and connected to the first and second balanced circuits, wherein
at least one of the plurality of first balanced circuits and of the plurality of second balanced circuits is arranged so that a pair of signal lines carrying signals identical in phase are connected to each other via a resistor, and
a first of the pair of signal lines is connected to a first of the plurality of balanced circuits and a second of the pair of signal lines is connected to a second of the plurality of balanced circuits, adjacent to the first of the plurality of balanced circuits.

12. The semiconductor device according to claim 11, wherein at least one of the first and second balanced circuits includes a first inductor, a second inductor, and a capacitor connected between the first inductors and the second inductor, the capacitor being connected to a virtual grounding node.

13. The semiconductor device according to claim 12, wherein the virtual grounding node is connected to a power supply source via a resistor.

* * * * *